March 21, 1961 J. B. HEINICKE ET AL 2,976,340

REFRIGERATING APPARATUS

Filed March 5, 1958

INVENTORS.

John B. Heinicke
William J. Fretague

By: Schroeder, Hofgren, Brady & Wegner

Attys.

United States Patent Office 2,976,340

Patented Mar. 21, 1961

2,976,340

REFRIGERATING APPARATUS

John B. Heinicke, Benton Harbor, and William J. Fretague, South Haven, Mich., assignors to Whirlpool Corporation, a corporation of Delaware Filed Mar. 5, 1958, Ser. No. 719,344

6 Claims. (Cl. 136—4)

This invention relates to a thermoelectric assembly.

In heating or cooling by means of a thermo-electric device, thermoelectric means are provided in which hot and cold junctions are produced between pairs of dissimilar thermoelectric elements when thermoelectrically interconnected to either pump heat to or extract heat from one side of the device. In such devices, it is desirable to have a structurally strong assembly to withstand abuse, to provide good electrical contact between electrically conducting parts, to provide relatively unbreakable joints and to be able to replace simply a defective thermoelectric element.

One of the features of this invention is to provide a thermoelectric assembly comprising a hollow dielectric connector, a thermoelectric element within the connector, a pair of spaced apart terminal members fastened to said connector and positioned one adjacent each end thereof with one terminal member in electrically conducting relation with the element, and a concavo-convex joint electrically connecting the other terminal member to the thermoelectric element.

Other features and advantages of the invention will be apparent from the illustrative embodiment of the invention shown in the accompanying drawings. Of the drawings.

Figure 1:
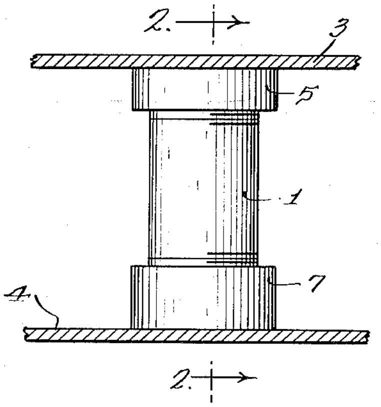
Figure 1 is a side elevational view of a thermoelectric assembly embodying the invention.

In the thermoelectric assembly shown in the accompanying drawings, a hollow dielectric connector 1 receives a thermoelectric element 2 and a pair of spaced apart terminal members 3 and 4 are at opposite ends thereof and fastened thereto.

The disclosed thermoelectric assembly when associated with a dissimilar thermoelectric element forms a thermoelectric couple having a hot junction on one side and a cold junction on the other when the couple is subjected to a thermoelectric current. Such thermocouples and their operation are, of course, well known to those skilled in the art.

The hollow connector or sleeve 1 is made of an air impervious dielectric material such as a plastic or a ceramic. One such material is rigid nylon. The connector is fastened to the terminal member 3 by a threaded connection with an inwardly extending annular collar 5 on the terminal member 3. The opposite end of the hollow connector 1 is fastened to the terminal member 4 by a threaded connection with an inwardly extending annular collar 7 on the terminal member 4. The terminal members 3 and 4 are formed of electrically conducting material preferably copper or aluminum.

In order to insure good conductivity a deposit 8 of soft electrically conducting material is placed at both ends of the thermoelectric element 2. These materials are well known in the art and include mercury, copper or aluminum powder or paste, silver powder or paste, dead soft metal amalgamate and preferably copper amalgamate, and the like.

The terminal member 4 has an inwardly extending projection 9 extending within the hollow connector 1 into engagement with one deposit 8 of material to be in electrically conducting relation with the thermoelectric element 2.

The terminal member 3 has an opening 10 of a size through which a thermoelectric element 2 may pass and a connecting member here shown as a ball and socket joint including a cap 11 is provided to insure a full flat contact between the thermoelectric element 2 and the terminal member 3. The cap 11 is threadably connected at 12 to the terminal member 3. The ball and socket joint includes a plug member 13 within the hollow connector 1 and in contact with the adjacent deposit 8 of electrically conducting material. The member 13 has a dished out area 14 substantially across an entire end thereof which receives a dome shaped projection 15 on the cap 11. The area 14 and projection each have the configuration of a section of a sphere and are close fitting to provide good contact.

The plug member 13 and cap 11 are formed of electrically conducting material such as copper and to facilitate good electrical connection between these parts a conducting layer 16 similar to the layer 8 may be positioned therebetween.

An assembly somewhat similar to the one of the invention is shown, described and claimed in the copending application of John Roeder, Jr., Serial No. 720,793, filed March 11, 1958, and assigned to the same assignee.

Figure 2:
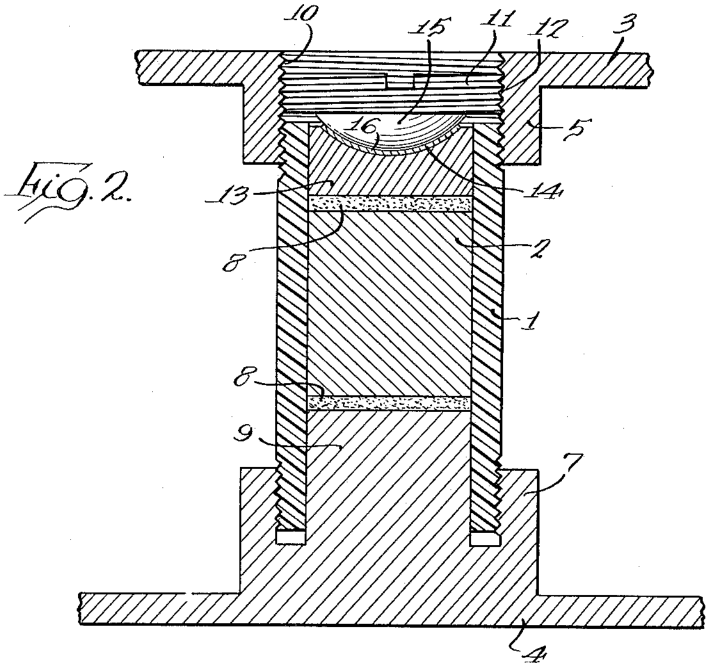
Figure 2 is a sectional view taken substantially along line 2—2 of Figure 1.

The structure disclosed herein provides a sturdy interconnection between the terminal members and thermoelectric element in which a good contact is made between the thermoelectric element and the associated terminal members and in which replacement of a defective thermoelectric element is extremely simple. In addition, the ball and socket arrangement insures good electrical contact, the parts self-aligning themselves as the cap is threaded to the assembled position of Fig. 2.

Having described our invention as related to the embodiment shown in the accompanying drawings, it is our intention that the invention be not limited by any of the details of description, unless otherwise specified, but rather be construed broadly within its spirit and scope as set out in the accompanying claims.

We claim:

1. A thermoelectric assembly, comprising: a hollow dielectric connector; a thermoelectric element within said connector; a pair of spaced apart terminal members fastened to said connector and positioned one adjacent each end thereof with one terminal member in electrically conducting relation with said element; and a two-part joint thermoelectrically connecting said other terminal member to the thermoelectric element with one part in electrically conducting relation with said other terminal member and adjustably positionable thereon and the other part movably mounted within said connector and in electrically conducting relationship with said thermoelectric element, confronting portions of said parts being complementarily concavo-convex to permit surface contact therebetween notwithstanding a skewed relationship between said parts.

2. A thermoelectric assembly, comprising: a hollow dielectric connector; a thermoelectric element therein; a pair of spaced apart terminal members fastened to said connector and positioned adjacent the ends of the element, one terminal member in electrically conducting relation with said element and the other terminal member having an opening of a size to permit passage of the element therethrough; a plug member in said hollow connector adjacent said other terminal member and in electrically conducting relation with said thermoelectric element; and a cap member threadably mounted in said opening and having an area in contact with substantially the entire adjacent face of the plug, said contacting area and face being of concavo-convex configuration.

3. The assembly of claim 2 wherein said contacting area and face forms a ball and socket connection.

4. A thermoelectric assembly, comprising: a hollow dielectric connector; a thermoelectric element within said connector; a pair of spaced apart terminal members fastened to said connector and positioned one adjacent each end thereof with one terminal member in electrically conducting relation with said element; and a concavo-convex joint thermoelectrically connecting said other terminal member to the thermoelectric element and wherein the joint includes a cap threadably connected to said other terminal member.

5. A thermoelectric assembly, comprising: a thermoelectric element having a pair of ends; a first terminal member positioned adjacent one end of the thermoelectric element in electrically conducting relation thereto; a second terminal member positioned adjacent another end of the element and in fixed spaced relationship with the first terminal member; and a connecting member interconnecting the second terminal member and said other end of the thermoelectric element, said connecting member including two rigid parts having joining surfaces providing surface contact therebetween in any of a plurality of skewed positions of one of said parts relative to the other part, said parts being in electrically conducting relationship, one part threadably engaging the second terminal member in electrically conducting relation therewith and the other part being in electrically conducting relation with the thermoelectric element.

6. The assembly of claim 5 wherein said surfaces are concavo-convex to provide a ball and socket joint.

References Cited in the file of this patent

UNITED STATES PATENTS

| | | |
|---|---|---|
| 1,848,655 | Petrik | Mar. 8, 1932 |
| 2,844,638 | Lindenblad | July 22, 1958 |
| 2,872,788 | Lindenblad | Feb. 10, 1959 |